(12) United States Patent
Nakayama et al.

(10) Patent No.: US 9,732,004 B2
(45) Date of Patent: *Aug. 15, 2017

(54) OXIDE SINTERED BODY, SPUTTERING TARGET, AND OXIDE SEMICONDUCTOR THIN FILM OBTAINED USING SPUTTERING TARGET

(71) Applicant: SUMITOMO METAL MINING CO., LTD., Tokyo (JP)

(72) Inventors: Tokuyuki Nakayama, Ome (JP); Eiichiro Nishimura, Ome (JP); Fumihiko Matsumura, Ome (JP); Masashi Iwara, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/303,864

(22) PCT Filed: Apr. 15, 2015

(86) PCT No.: PCT/JP2015/061584
§ 371 (c)(1),
(2) Date: Oct. 13, 2016

(87) PCT Pub. No.: WO2015/159916
PCT Pub. Date: Oct. 22, 2015

(65) Prior Publication Data
US 2017/0029335 A1    Feb. 2, 2017

(30) Foreign Application Priority Data

Apr. 17, 2014  (JP) .................. 2014-085874

(51) Int. Cl.
| | | |
|---|---|---|
| C04B 35/45 | (2006.01) | |
| C04B 35/00 | (2006.01) | |
| C23C 14/08 | (2006.01) | |
| C23C 14/34 | (2006.01) | |
| C04B 35/622 | (2006.01) | |
| C23C 14/58 | (2006.01) | |
| H01J 37/34 | (2006.01) | |
| H01L 21/02 | (2006.01) | |
| H01L 29/04 | (2006.01) | |
| H01L 29/66 | (2006.01) | |
| H01L 29/786 | (2006.01) | |

(52) U.S. Cl.
CPC .............. *C04B 35/45* (2013.01); *C04B 35/00* (2013.01); *C04B 35/62218* (2013.01); *C23C 14/08* (2013.01); *C23C 14/086* (2013.01); *C23C 14/087* (2013.01); *C23C 14/34* (2013.01); *C23C 14/3414* (2013.01); *C23C 14/5806* (2013.01); *H01J 37/3429* (2013.01); *H01L 21/02565* (2013.01); *H01L 21/02592* (2013.01); *H01L 21/02631* (2013.01); *H01L 21/02667* (2013.01); *H01L 29/04* (2013.01); *H01L 29/6675* (2013.01); *H01L 29/78693* (2013.01); *C04B 2235/3282* (2013.01); *C04B 2235/3286* (2013.01)

(58) Field of Classification Search
CPC ..... C23C 14/086; C23C 14/087; C23C 14/08; C23C 14/34; C04B 35/00
USPC ...... 252/519.13, 518.1, 519.1; 423/604, 624, 423/593.1
See application file for complete search history.

(56) References Cited

U.S. PATENT DOCUMENTS

| | | | |
|---|---|---|---|
| 8,668,849 B2 * | 3/2014 | Inoue .................. | C23C 14/086 252/518.1 |
| 2004/0180217 A1 | 9/2004 | Inoue | |
| 2007/0194379 A1 | 8/2007 | Hosono | |
| 2008/0038529 A1 * | 2/2008 | Nakayama ............. | C23C 14/08 428/220 |
| 2011/0062436 A1 | 3/2011 | Yamazaki | |

(Continued)

FOREIGN PATENT DOCUMENTS

| | | |
|---|---|---|
| CN | 103030381 A | 4/2013 |
| JP | 2004-186572 A1 | 7/2004 |

(Continued)

OTHER PUBLICATIONS

Nakayama, Tokuyuki et al., U.S. Appl. No. 15/303,878, filed Oct. 13, 2016.
Office Action issued to TW Application No. 104112197, mailed Nov. 3, 2015 (5 Sheets).
A. Takagi, et al.; "Carrier transport and electronic structure in amorphous oxide semiconductor, a-13 InGaZnO4;" Thin Solid Films; vol. 486; 2005; pp. 38-41 (4 Sheets).
Office Action issued to TW Application No. 104112196, mailed Aug. 18, 2016 (4 Sheets).

(Continued)

*Primary Examiner* — Douglas McGinty
(74) *Attorney, Agent, or Firm* — Kratz, Quintos & Hanson, LLP

(57) ABSTRACT

Provided are: a sintered oxide which is capable of obtaining low carrier density and high carrier mobility when configured as an oxide semiconductor thin film by using a sputtering method; and a sputtering target which uses the same. The sintered oxide contains indium, gallium and copper as oxides. It is preferable for the gallium content to be at least 0.08 and less than 0.20 when expressed as an atomic ratio (Ga/(In+Ga)), the copper content to be at least 0.001 and less than 0.03 when expressed as an atomic ratio (Cu/(In+Ga+Cu)), and for the sintering to be performed at 1,200-1,550° C., inclusive. A crystalline oxide semiconductor thin film obtained by forming this sintered oxide as a sputtering target makes it possible to achieve a carrier density of $1.0 \times 10^{18}$ $cm^{-3}$ or lower, and a carrier mobility of 10 $cm^2$ $V^{-1}$ $sec^{-1}$ or higher.

9 Claims, No Drawings

(56) References Cited

U.S. PATENT DOCUMENTS

| | | | |
|---|---|---|---|
| 2011/0180763 A1 | 7/2011 | Utsuno | |
| 2011/0315936 A1* | 12/2011 | Inoue | C23C 14/086 |
| | | | 252/512 |
| 2012/0273777 A1* | 11/2012 | Inoue | C23C 14/086 |
| | | | 257/43 |
| 2013/0202850 A1 | 8/2013 | Nakayama | |
| 2013/0276879 A1 | 10/2013 | Kuramochi | |
| 2014/0001469 A1* | 1/2014 | Park | H01L 29/78693 |
| | | | 257/43 |
| 2016/0348229 A1* | 12/2016 | Nakayama | H01L 21/02631 |
| 2016/0348230 A1* | 12/2016 | Nakayama | H01L 21/02631 |

FOREIGN PATENT DOCUMENTS

| | | |
|---|---|---|
| JP | 2007-223849 A1 | 9/2007 |
| JP | 2007-277039 A1 | 10/2007 |
| JP | 2010-219538 A1 | 9/2010 |
| JP | 2011-252231 A1 | 12/2011 |
| JP | 2012-012659 A1 | 1/2012 |
| JP | 2012-136415 A1 | 7/2012 |
| JP | 2012-253372 A1 | 12/2012 |
| WO | 03/014409 A1 | 2/2003 |
| WO | 2010/032422 A1 | 3/2010 |

OTHER PUBLICATIONS

International Search Report for International Application No. PCT/JP2015/061584 dated Jun. 9, 2015.

* cited by examiner

US 9,732,004 B2

OXIDE SINTERED BODY, SPUTTERING TARGET, AND OXIDE SEMICONDUCTOR THIN FILM OBTAINED USING SPUTTERING TARGET

TECHNICAL FIELD

The present invention relates to an oxide sintered body, a target, and an oxide semiconductor thin film obtained by using the target, and more particularly to a sputtering target that achieves reduced carrier density of a crystalline oxide semiconductor thin film when the sputtering target contains copper, a copper-containing oxide sintered body most suitable for obtaining the sputtering target, and a copper-containing crystalline oxide semiconductor thin film that is obtained by using the sputtering target and has low carrier density and high carrier mobility.

BACKGROUND ART

Thin film transistors (TFTs) are a type of field effect transistors (hereinafter referred to as FETs). TFTs are three-terminal elements having a gate terminal, a source terminal, and a drain terminal in the basic structure. TFTs are active elements having a function of switching the current between the source terminal and the drain terminal so that a semiconductor thin film deposited on a substrate is used as a channel layer in which electrons or holes move and a voltage is applied to the gate terminal to control the current flowing in the channel layer. TFTs are electronic devices that are most widely used these days in practical application. Typical applications of TFTs include liquid-crystal driving elements.

Currently, most widely used TFTs are metal-insulator-semiconductor-FETs (MIS-FETs) in which a polycrystalline silicon film or an amorphous silicon film is used as a channel layer material.

MIS-FETs including silicon are opaque to visible light and thus fail to form transparent circuits. Therefore, when MIS-FETs are used as switching elements for driving liquid crystals in liquid crystal displays, the aperture ratio of a display pixel in the devices is small.

Due to the recent need for high-resolution liquid crystals, switching elements for driving liquid crystals now require high-speed driving. In order to achieve high-speed driving, a semiconductor thin film in which the mobility of electrons or holes, is higher than that in at least amorphous silicon needs to be used as a channel layer.

Under such circumstances, Patent Document 1 proposes a transparent semi-insulating amorphous oxide thin film which is a transparent amorphous oxide thin film deposited by vapor-phase film deposition method and containing elements of In, Ga, Zn, and O. The composition of the oxide is $InGaO_3(ZnO)_m$, (m is a natural number less than 6) when the oxide is crystallized. The transparent semi-insulating amorphous oxide thin film is a semi-insulating thin film having a carrier mobility (also referred to as carrier electron mobility) of more than 1 $cm^2$ $V^{-1}$ $sec^{-1}$, and a carrier density (also referred to as carrier electron density) of $10^{16}$ $cm^{-3}$ or less without doping with an impurity ion. Patent Document 1 also proposes a thin film transistor in which the transparent semi-insulating amorphous oxide thin film is used as a channel layer.

However, the transparent amorphous oxide thin film (a-IGZO film) which is proposed in Patent Document 1, formed by either a vapor deposition method of a sputtering method or a pulsed laser deposition method, and composed of elements of In, Ga, Zn, and O has a relatively high electron carrier mobility in a range of about from 1 to 10 $cm^2$ $V^{-1}$ $sec^{-1}$, but the instability has been often pointed out as a problem when forming a device such as a TFT as the fact that the amorphous oxide thin film is originally likely to generate oxygen loss and the behavior of the electron carrier is not always stable against external factors such as heat caused adverse effects.

As a material to solve such a problem, Patent Document 2 proposes a thin film transistor including an oxide thin film in which gallium is dissolved in indium oxide. In the oxide thin film, the Ga/(Ga+In) atomic ratio is 0.001 to 0.12, and the percentage of indium and gallium with respect to the total metal atoms is 80 at % or more. The oxide thin film has an $In_2O_3$ bixbyite structure. An oxide sintered body is proposed as the material of the oxide thin film in which gallium is dissolved in indium oxide. In the oxide sintered body, the Ga/(Ga+In) atomic ratio is 0.001 to 0.12, and the percentage of indium and gallium with respect to the total metal atoms is 80 at % or more. The oxide sintered body has an $In_2O_3$ bixbyite structure.

However, the carrier density described in Examples 1 to 8 of Patent Document 2 is at the level of $10^{18}$ $cm^{-3}$, and there is still a problem that the carrier density is too high for an oxide semiconductor thin film to be applied to a TFT.

In addition, in Patent Document 3, a sintered body in which the gallium content ratio and the copper content ratio in indium, gallium, and copper are more than 0.001 and less than 0.09 in terms of atomic ratio is disclosed.

However, the sintered body disclosed in Patent Document 3 is substantially an $In_2O_3$ phase having a bixbyite-type structure or an $In_2O_3$ phase having a bixbyite-type structure and an $In_2Ga_2CuO_7$ phase having a hexagonal structure and/or an $InGaCuO_4$ phase have having a rhombohedral structure, but the density of the sintered body is low because the sintering temperature is from 1000° C. to 1100° C. and phases having a relatively high electrical resistance are formed other than the $In_2O_3$ phase, and thus there is a problem in that nodules are likely to be generated in the mass-production process of film deposition by sputtering to introduce a high-power density.

Patent Document 1: Japanese Unexamined Patent Application, Publication No. 2010-219538
Patent Document 2: PCT International Publication No. WO2010/032422
Patent Document 3: Japanese Unexamined Patent Application, Publication No. 2012-012659
Patent Document 4: PCT International Publication No. WO2003/014409
Patent Document 5: Japanese Unexamined Patent Application, Publication No. 2012-253372

DISCLOSURE OF THE INVENTION

Problems to be Solved by the Invention

An object of the present invention is to provide a sputtering target that enables formation of a crystalline oxide semiconductor thin film having reduced carrier density, an oxide sintered body most suitable for obtaining the sputtering target, and an oxide semiconductor thin film that is obtained by using the sputtering target and has low carrier density and high carrier mobility.

Means for Solving the Problems

The inventors of the present invention have newly found that, in particular, an oxide sintered body that is sintered by containing a small amount of copper, specifically 0.001 or more and less than 0.03 in terms of the ratio of Cu/(In+Ga+Cu) to an oxide sintered body containing gallium as an oxide at 0.08 or more and less than 0.20 in terms of the ratio of gallium to indium Ga/(In+Ga) is substantially composed of an $In_2O_3$ phase having a bixbyite-type structure, and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase, and an oxide semiconductor thin film which is formed by using the oxide sintered body has a carrier mobility of 10 cm$^2$ V$^{-1}$ sec$^{-1}$ or more.

That is, in a first embodiment of the present invention, an oxide sintered body includes indium, gallium, and copper as oxides. The gallium content is 0.08 or more and less than 0.20 in terms of Ga/(In+Ga) atomic ratio. The copper content is 0.001 or more and less than 0.03 in terms of Cu/(In+Ga+Cu) atomic ratio. The oxide sintered body is composed of an $In_2O_3$ phase having a bixbyite-type structure, and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase.

In a second embodiment of the present invention, the copper content is 0.001 or more and 0.015 or less in terms of Cu/(In+Ga+Cu) atomic ratio in the oxide sintered body according to the first embodiment.

In a third embodiment of the present invention, the gallium content is 0.08 or more and 0.15 or less in terms of Ga/(In+Ga) atomic ratio in the oxide sintered body according to the first or second embodiment.

In a fourth embodiment of the present invention, the oxide sintered body according to any one of the first to third embodiments is substantially free of positive divalent elements other than copper and positive trivalent to positive hexavalent elements other than indium and gallium.

In a fifth embodiment of the present invention, an X-ray diffraction peak intensity ratio of the $GaInO_3$ phase having a $\beta$-$Ga_2O_3$-type structure defined by formula 1 below is in the range of from 2% or more to 77% or less in the oxide sintered body according to any one of the first to fourth embodiments:

100×I [GaInO$_3$ phase (111)]/{I [In$_2$O$_3$ phase (400)]+I [GaInO$_3$ phase (111)]}[%]        Formula 1

In a sixth embodiment of the present invention, a sputtering target is obtained by machining the oxide sintered body according to any one of the first to fifth embodiments.

In a seventh embodiment of the present invention, a crystalline oxide semiconductor thin film is obtained by being formed on a substrate by sputtering using the sputtering target according to the sixth embodiment and by being crystallized by a heat treatment in an oxidizing atmosphere.

In an eighth embodiment of the present invention, the oxide semiconductor thin film according to the seventh embodiment has a carrier mobility of 10 cm$^2$ V$^{-1}$ sec$^{-1}$ or more.

In a ninth embodiment of the present invention, the oxide semiconductor thin film according to the seventh or eighth embodiment has a carrier density of 1.0×10$^{18}$ cm$^{-3}$ or less.

Effects of the Invention

When the oxide sintered body of the present invention which contains indium and gallium as oxides and copper at 0.001 or more and less than 0.03 in terms of Cu/(In+Ga+Cu) atomic ratio is used, for example, as a sputtering target, the crystalline oxide semiconductor thin film of the present invention that is formed by film deposition by sputtering and then subjected to a heat treatment can be obtained. The crystalline oxide semiconductor thin film has a bixbyite structure and contains a predetermined amount of copper, and thus an effect of lowering the carrier density is obtained. Accordingly, it is possible to increase on/off of the TFT when the crystalline oxide semiconductor thin film of the present invention is applied to a TFT. In the present invention, not only the carrier density is suppressed but also the oxide sintered body is substantially composed of an $In_2O_3$ phase having a bixbyite-type structure, and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase, and thus it is possible to stably obtain an excellent oxide semiconductor film having a carrier mobility of 10 cm$^2$ V$^{-1}$ sec$^{-1}$ or more through film deposition by sputtering. Therefore, the oxide sintered body, the target, and the oxide semiconductor thin film obtained by using the target of the present invention are industrially very useful.

PREFERRED MODE FOR CARRYING OUT THE INVENTION

An oxide sintered body, a sputtering target, and an oxide thin film of the present invention will be described below in detail.

The oxide sintered body of the present invention contains indium, gallium, and copper as oxides, in which the gallium content is 0.08 or more and less than 0.20 in terms of Ga/(In+Ga) atomic ratio, and the copper content is 0.001 or more and less than 0.03 in terms of Cu/(In+Ga+Cu) atomic ratio.

The gallium content, in terms of Ga/(In+Ga) atomic ratio, is 0.08 or more and less than 0.20 and more preferably 0.08 or more and 0.15 or less.

Gallium has an effect of reducing the oxygen loss in the crystalline oxide semiconductor thin film of the present invention because gallium has high oxygen-bonding strength. hen the gallium content is less than 0.08 in terms of Ga/(In+Ga) atomic ratio, this effect is not sufficiently obtained. On the other hand, when the gallium content is more than 0.20 in terms of Ga/(In+Ga) atomic ratio, the crystallization temperature is too high, and thus it is impossible to increase the crystallinity in a temperature range that is regarded to be favorable in the semiconductor process and the carrier mobility is not high enough as an oxide semiconductor thin film.

The oxide sintered body of the present invention contains copper in addition to indium and gallium in the composition ranges defined above. The copper concentration, in terms of Cu/(In+Ga+Cu) atomic ratio, is 0.001 or more and less than 0.03 and preferably 0.001 or more and 0.015 or less.

Doping with Cu in this range suppresses the carrier density of the oxide sintered body according to the present invention by the action of neutralizing the electrons generated mainly by the oxygen loss, and this effect allows the on/off ratio of TFTs to increase when the crystalline oxide semiconductor thin film of the present invention is used in TFTs.

It is preferred that the oxide sintered body of the present invention be substantially free of elements M, which are positive divalent elements other than copper and positive trivalent to positive hexavalent elements other than indium and gallium. The term "substantially free of elements M" as used herein means that the content of each element M, in terms of M/(In+Ga+M) atomic ratio, is 500 ppm or less, preferably 200 ppm or less, and more preferably 100 ppm or less. Specific examples of the element M include positive divalent elements, such as Mg, Ni, Co, Zn, Ca, Sr, and Pb; positive trivalent elements, such as Al, Y, Sc, B, and lanthanoids; positive tetravalent elements, such as Sn, Ge, Ti, Si, Zr, Hf, C, and Ce; positive pentavalent elements, such as Nb and Ta; and positive hexavalent elements, such as W and Mo.

1. Structure of Oxide Sintered Body

It is preferred that the oxide sintered body of the present invention is composed mainly of an $In_2O_3$ phase having a bixbyite-type structure and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase.

When the oxide sintered body is composed only of the $In_2O_3$ phase, nodules are generated regardless of the content of Cu, for example, in the same manner as in Comparative Example 11 of Patent Document 4 (WO2003/014409).

On the other hand, an $In_2Ga_2CuO_7$ phase and an $InGaCuO_4$ phase have higher electrical resistance than the $In_2O_3$ phase or the $GaInO_3$ phase so that they are likely to remain on the film formed by sputtering and nodules are likely to be generated. In addition, in the oxide semiconductor thin film formed by sputtering using an oxide sintered body having these phases generated, the crystallinity of the $In_2O_3$ phase is low and the carrier mobility tends to decrease.

Gallium and copper dissolve in the $In_2O_3$ phase. In addition, gallium makes up the $GaInO_3$ phase and the $(Ga, In)_2O_3$ phase. When gallium and copper dissolve in the $In_2O_3$ phase, they substitute for indium, which is also a trivalent cation, at its lattice positions. It is not preferred that gallium does not dissolve in the $In_2O_3$ phase but forms the $Ga_2O_3$ phase having a $\beta$-$Ga_2O_3$-type structure because of unsuccessful sintering or the like. Since the $Ga_2O_3$ phase has low conductivity, abnormal discharge arises.

The oxide sintered body of the present invention may include only the $GaInO_3$ phase having a $\beta$-$Ga_2O_3$-type structure, or the $GaInO_3$ phase having a $\beta$-$Ga_2O_3$-type structure and the $(Ga, In)_2O_3$ phase in the range in which the X-ray diffraction peak intensity ratio defined by formula 1 below is 2% or more and 77% or less other than the $In_2O_3$ phase having a bixbyite-type structure.

100×I [GaInO₃ phase (111)]/{I [In₂O₃ phase (400)]+I [GaInO₃ phase (111)]}[%]    Formula 1

(wherein I [$In_2O_3$ phase (400)] represents a (400) peak intensity of the $In_2O_3$ phase having a bixbyite-type structure, and I [$GaInO_3$ phase (111)] represents a (111) peak intensity of the complex oxide $\beta$-$GaInO_3$ phase having a $\beta$-$Ga_2O_3$-type structure.)

2. Method for Producing Oxide Sintered Body

The oxide sintered body of the present invention uses oxide powders composed of an indium oxide powder and a gallium oxide powder and a copper(II) oxide powder as raw material powders.

In the process for producing the oxide sintered body of the present invention, these raw material powders are mixed and then compacted, and the compact is sintered by ordinary-pressure sintering. The formed phases in the structure of the oxide sintered body of the present invention strongly depend on the conditions in each step for producing the oxide sintered body, for example, the particle size of the raw material powders, the mixing conditions, and the sintering conditions.

It is preferred that the structure of the oxide sintered body of the present invention is composed in a desired ratio of the $In_2O_3$ phase having a bixbyite-type structure, and the $GaInO_3$ phase having a $\beta$-$Ga_2O_3$-type structure as the formed phase other than the $In_2O_3$ phase, or the $GaInO_3$ phase having a $\beta$-$Ga_2O_3$-type structure and the $(Ga, In)_2O_3$ phase as the formed phase other than the $In_2O_3$ phase. For this, the mean particle size of the raw material powders is preferably 3 μm or less and more preferably 1.5 μm or less. As described above, the oxide sintered body includes the $GaInO_3$ phase having a $\beta$-$Ga_2O_3$-type structure, or the $GaInO_3$ phase having a $\beta$-$Ga_2O_3$-type structure and the $(Ga, In)_2O_3$ phase other than the $In_2O_3$ phase, and thus the mean particle size of the raw material powders is preferably 1.5 μm or less in order to suppress the excessive formation of these phases.

Indium oxide powder is a raw material for ITO (tin-doped indium oxide), and fine indium oxide powder having good sintering properties has been developed along with improvements in ITO. Since indium oxide powder has been continuously used in large quantities as a raw material for ITO, raw material powder having a mean particle size of 0.8 μm or less is available these days.

However, since the amount of gallium oxide powder or copper(II) oxide powder used is still smaller than that of the indium oxide powder used, it may be difficult to obtain raw material powder having a mean particle size of 1.5 μm or less. Therefore, when only coarse gallium oxide powder is available, the powder needs to be pulverized into particles having a mean particle size of 1.5 μm or less.

In the process for sintering the oxide sintered body of the present invention, ordinary-pressure sintering is preferably employed. Ordinary-pressure sintering is a simple and industrially advantageous method, and is also an economically preferable means.

When ordinary-pressure sintering is used, a compact is first produced as described above.

Raw material powders are placed in a resin pot and mixed with a binder (for example, PVA) and the like by wet ball milling or the like. In the production of the oxide sintered body of the present invention, in order to suppress the excessive formation of the $GaInO_3$ phase having a $\beta$-$Ga_2O_3$-type structure, or the $GaInO_3$ phase having a $\beta$-$Ga_2O_3$-type structure and the $(Ga, In)_2O_3$ phase other than the $In_2O_3$ phase or to avoid formation of the $Ga_2O_3$ phase having a $\beta$-$Ga_2O_3$-type structure, the ball mill mixing is preferably performed for 18 hours or longer. In this case, hard $ZrO_2$ balls are used as mixing balls. After mixing, the slurry is taken out, filtered, dried, and granulated. Subsequently, the resultant granulated material is compacted under a pressure of about 9.8 MPa (0.1 ton/cm$^2$) to 294 MPa (3 ton/cm$^2$) by cold isostatic pressing to form a compact.

The sintering process by ordinary-pressure sintering is preferably preformed in an atmosphere containing oxygen. The volume fraction of oxygen in the atmosphere is preferably over 20%. In particular, when the volume fraction of oxygen is over 20%, the oxide sintered body is further densified. An excessive amount of oxygen in the atmosphere causes the surface of the compact to undergo sintering in advance during the early stage of sintering. Subsequently, sintering proceeds while the inside of the compact is reduced, and a highly dense oxide sintered body is finally obtained.

In an atmosphere free of oxygen, the surface of the compact does not undergo sintering in advance, and as a result, densification of the sintered body does not proceed. If oxygen is free, indium oxide decomposes particularly at about 900° C. to 1000° C. to form metal indium, which makes it difficult to obtain a desired oxide sintered body.

The temperature range of ordinary-pressure sintering is preferably 1200° C. or higher and 1550° C. or lower, and more preferably 1350° C. or higher and 1450° C. or lower in an atmosphere obtained by introducing oxygen gas into air in a sintering furnace. The sintering time is preferably 10 to 30 hours, and more preferably 15 to 25 hours.

When the sintering temperature is in the above range, and oxide powders composed of the indium oxide powder and the gallium oxide powder and the copper(II) oxide powder that are controlled so as to have a mean particle size of 1.5 μm or less are used as raw material powders, an oxide sintered body that is composed of an $In_2O_3$ phase having a bixbyite-type structure, and a $GaInO_3$ phase having a β-$Ga_2O_3$-type structure as a formed phase other than the $In_2O_3$ phase, or a $GaInO_3$ phase having a β-$Ga_2O_3$-type structure and a $(Ga, In)_2O_3$ phase as a formed phase other than the $In_2O_3$ phase is obtained.

When the sintering temperature is lower than 1200° C., the sintering reaction does not sufficiently proceed and a disadvantage that the density of the oxide sintered body is less than 6.4 g/cm³ is caused. On the other hand, at a sintering temperature higher than 1550° C., formation of the $(Ga, In)_2O_3$ phase may become significant. The $(Ga, In)_2O_3$ phase has a higher electrical resistance than the $GaInO_3$ phase so as to cause a decrease in the deposition rate. A sintering temperature of 1550° C. or lower, namely, a small amount of the $(Ga, In)_2O_3$ phase is acceptable. From this point of view, the sintering temperature is preferably 1200° C. or higher and 1550° C. or lower and more preferably 1350° C. or higher and 1450° C. or lower.

The temperature elevation rate is preferably in the range of 0.2 to 5° C./min in order to advance debinding without forming cracks in the sintered body. As long as the temperature elevation rate is in this range, the temperature may be increased to the sintering temperature in a combination of different temperature elevation rates as desired. During the temperature elevation process, a particular temperature may be maintained for a certain time in order to advance debinding and sintering. Particularly in order to accelerate the dissolution of copper into the $In_2O_3$ phase, it is effective to maintain the temperature at 1100° C. or lower for a certain time. The retention time is not particularly limited and is preferably 1 hour or longer and 10 hours or shorter. After sintering, oxygen introduction is stopped before cooling. The temperature is preferably decreased to 1000° C. at a temperature drop rate in the range of 0.2 to 5° C./min and particularly 0.2° C./min or more and less than 1° C./min.

3. Target

The target of the present invention can be obtained by cutting the oxide sintered body described above into a predetermined size, subjecting the surface thereof to the polishing processing, and bonding the oxide sintered body that is polished to a backing plate. The target preferably has a flat shape, but may have a cylindrical shape. When a cylindrical target is used, it is preferred to suppress the generation of particles due to the target rotation.

For use as a sputtering target, the density of the oxide sintered body of the present invention is preferably 6.4 g/cm³ or more, and it is preferably 6.8 g/cm³ or more when the gallium content is 0.08 or more and less than 0.20 in terms of Ga/(In+Ga) atomic ratio. When the density is less than 6.4 g/cm³, nodules are generated during use in mass production.

4. Oxide Semiconductor Thin Film and Method for Depositing Oxide Semiconductor Thin Film The crystalline oxide semiconductor thin film according to the present invention is obtained as follows: once forming an amorphous thin film on a substrate by sputtering using the sputtering target; and subsequently subjecting the amorphous thin film to a heat treatment.

The sputtering target is obtained from the oxide sintered body, but the structure of the oxide sintered body, namely, the structure that is basically composed of an $In_2O_3$ phase having a bixbyite-type structure and a $GaInO_3$ phase having a β-$Ga_2O_3$-type structure, is important. To obtain the crystalline oxide semiconductor thin film according to the present invention, it is important that the amorphous oxide thin film that is once formed has a high crystallization temperature, but the crystallization temperature is related to the structure of the oxide sintered body. That is, when the oxide sintered body includes not only an $In_2O_3$ phase having a bixbyite-type structure but also a $GaInO_3$ phase having a β-$Ga_2O_3$-type structure as the oxide sintered body used in the present invention, the oxide thin film obtained from this oxide sintered body after film deposition has a high crystallization temperature, namely, a crystallization temperature of preferably 250° C. or higher, more preferably 300° C. or higher, and even more preferably 350° C. or higher. That is, the oxide thin film is a stable amorphous film. In contrast, when the oxide sintered body includes only an $In_2O_3$ phase having a bixbyite-type structure, the oxide thin film after film deposition has a crystallization temperature as low as about 190° C. to 230° C. and is an unstable amorphous oxide thin film in some cases, for example, as disclosed in Patent Document 2 (WO2010/032422). In this case, microcrystals are already generated after film deposition, and the generation of residues makes wet-etching patterning difficult.

Ordinary sputtering is used in the process for depositing the amorphous thin film, but particularly, direct current (DC) sputtering is industrially advantageous because the thermal effects are minimized during film deposition and high-rate deposition can be achieved. To form the oxide semiconductor thin film of the present invention by direct current sputtering, a gas mixture of an inert gas and oxygen, particularly a gas mixture of argon and oxygen, is preferably used as a sputtering gas. In addition, sputtering is preferably performed in a chamber of a sputtering apparatus at an internal pressure of 0.1 to 1 Pa, particularly 0.2 to 0.8 Pa.

The substrate is typically a glass substrate and is preferably an alkali-free glass substrate, but any resin sheet and resin film that withstands the above process conditions can be used.

In the process for forming the amorphous thin film, presputtering can be performed as follows: for example, after evacuation to $1 \times 10^{-4}$ Pa or less, introducing a gas mixture of argon and oxygen until the gas pressure reaches 0.2 to 0.5 Pa; and generating a direct current plasma by applying direct current power so that the direct current power with respect to the area of the target, namely, the direct current power density, is in the range of about 1 to 7 W/cm². It is preferred that, after this presputtering for 5 to 30 minutes, the substrate position be corrected as desired and then film deposition by sputtering be performed. In film deposition by sputtering, the direct current power applied is increased in the acceptable range in order to increase the deposition rate.

The crystalline oxide semiconductor thin film of the present invention is obtained by depositing the amorphous thin film and then crystallizing this through a heat treatment. The condition for the heat treatment is a temperature equal to or higher than the crystallization temperature in an oxidizing atmosphere. The oxidizing atmosphere is preferably an atmosphere containing oxygen, ozone, water vapor, nitrogen oxide, or the like. The temperature for the heat treatment is preferably 250 to 600° C., more preferably 300 to 550° C., and even more preferably 350 to 500° C. The time for the heat treatment, namely, the time during which the temperature for the heat treatment is maintained, is preferably 1 to 120 minutes, and more preferably 5 to 60 minutes. In an example method until crystallization, an amorphous film is once formed at a low temperature, for example, near room temperature or at a substrate temperature of 100 to 300° C., thereafter the oxide thin film is crystallized by being subjected to the heat treatment at a temperature equal to or higher than the crystallization temperature, or in another method, a crystalline oxide thin film is deposited by heating the substrate to a temperature equal to or higher than the crystallization temperature of the oxide thin film. The heating temperature in these two methods is generally 600° C. or lower, and the treatment temperature is not significantly different from that of the known semiconductor process described in Patent Document 5 (JP 2012-253372 A), for example.

The composition of indium, gallium, and copper in the amorphous thin film and the crystalline oxide semiconductor thin film are approximately the same as the composition of the oxide sintered body of the present invention. That is, it is a crystalline oxide semiconductor thin film which contains indium and gallium as oxides and further contains copper. The gallium content is 0.08 or more and less than 0.20 in terms of Ga/(In+Ga) atomic ratio, and the copper content is 0.001 or more and less than 0.03 in terms of Cu/(In+Ga+Cu) atomic ratio. The gallium content is more preferably 0.08 or more and 0.15 or less in terms of Ga/(In+Ga) atomic ratio. In addition, the copper content is more preferably 0.001 or more and 0.015 or less in terms of Cu/(In+Ga+Cu) atomic ratio.

The crystalline oxide semiconductor thin film of the present invention is preferably composed only of the $In_2O_3$ phase of a bixbyite structure. In the $In_2O_3$ phase, gallium is substitutionally dissolved in the lattice positions of indium, which is a trivalent cation, and copper is substitutionally dissolved therein in the same manner as in the oxide sintered body. In the crystalline oxide semiconductor thin film of the present invention, the carrier density decreases to $1.0 \times 10^{18}$ $cm^{-3}$ or less and the carrier density of $8.0 \times 10^{17}$ $cm^{-3}$ or less is more preferably obtained by the action of neutralizing the carrier electrons to be mainly generated by oxygen loss through the addition of copper. An oxide semiconductor thin film containing indium in a great amount is in a degenerate state when the carrier density is $4.0 \times 10^{18}$ $cm^{-3}$ or more, and a TFT including such an oxide semiconductor thin film as a channel layer thus does not exhibit normally-off characteristics. Therefore, the crystalline oxide semiconductor thin film according to the present invention is advantageous in that the carrier density is controlled in the range in which the TFT exhibits normally-off characteristics. In addition, by this, the carrier mobility is 10 $cm^2$ $V^{-1}$ $sec^{-1}$ or more, more preferably 17 $cm^2$ $V^{-1}$ $sec^{-1}$ or more, and even more preferably 20 $cm^2$ $V^{-1}$ $sec^{-1}$ or more.

The crystalline oxide semiconductor thin film according to the present invention is subjected to micromachining, which is required in applications such as TFTs, by wet etching or dry etching. When an amorphous film is once formed at a low temperature and the oxide thin film is then crystallized by being subjected to a heat treatment at a temperature equal to or higher than the crystallization temperature, the amorphous film may be micromachined by wet etching using a weak acid after being formed. Most weak acids can be used, but a weak acid composed mainly of oxalic acid is preferred. For example, commercial products, such as ITO-06N available from Kanto Chemical Co., Inc., can be used. When a crystalline oxide thin film is deposited by heating the substrate to a temperature to be equal to or higher than the crystallization temperature of the oxide thin film, for example, wet etching or dry etching using a strong acid such as an aqueous solution of ferric chloride can be applied, but dry etching is preferred in consideration of the damage to the vicinity of a TFT.

Although the thickness of the crystalline oxide semiconductor thin film of the present invention is not limited, the thickness is 10 to 500 nm, preferably 20 to 300 nm, and more preferably 30 to 100 nm. When the thickness is less than 10 nm, sufficient crystallinity is not obtained, and as a result, high carrier mobility is not achieved. On the other hand, when the thickness is more than 500 nm, it is disadvantageous in that a problem associated with productivity arises.

EXAMPLES

A more detailed description is provided below by way of Examples of the present invention, but the present invention is not limited by these Examples.

<Evaluation of Oxide Sintered Body>

The composition of metal elements in the obtained oxide sintered body was determined by ICP emission spectrometry. The formed phases were identified by a powder method with an X-ray diffractometer (available from Philips) using rejects of the obtained oxide sintered body.

<Evaluation of Basic Properties of Oxide Thin Film>

The composition of the obtained oxide thin film was determined by ICP emission spectrometry. The thickness of the oxide thin film was determined with a surface profilometer (available from KLA-Tencor Corporation). The deposition rate was calculated from the film thickness and the film deposition time. The carrier density and mobility of the oxide thin film were determined with a Hall-effect measurement apparatus (available from TOYO Corporation). The formed phases in the film were identified by X-ray diffraction measurement.

(Preparation and Evaluation of Sintered Body)

An indium oxide powder, a gallium oxide powder, and a copper(II) oxide powder were prepared as raw material powders so that each powder has a mean particle size of 1.5 μm or less. These raw material powders were combined so as to obtain the Ga/(In+Ga) atomic ratio and the Cu/(In+Ga+Cu) atomic ratio of Examples and Comparative Examples shown in Tables 1 and 2, placed in a resin pot together with water, and mixed by wet ball milling. In this case, hard $ZrO_2$ balls were used, and the mixing time was 18 hours. After mixing, the slurry was taken out, filtered, dried, and granulated.

The granulated material was compacted by cold isostatic pressing under a pressure of 3 ton/$cm^2$.

Next, the compact was sintered as described below.

The compact was sintered at a sintering temperature of between 1000 and 1550° C. for 20 hours in an atmosphere obtained by introducing oxygen into air in a sintering furnace at a rate of 5 L/min per 0.1 $m^3$ furnace volume. At this time, the temperature was increased by 1° C./min, oxygen introduction was stopped during cooling after sintering, and the temperature was decreased to 1000° C. by 10° C./min.

The composition of the obtained oxide sintered body was analyzed by ICP emission spectrometry. As a result, it was confirmed that the composition of the metal elements substantially corresponds to the composition prepared at the time of mixing raw material powders in all Examples.

Next, the phases of the oxide sintered body were identified by X-ray diffraction measurement, and only the diffraction peak attributed to the $In_2O_3$ phase having a bixbyite-type structure or only the diffraction peaks attributed to the $In_2O_3$ phase having a bixbyite-type structure and the $GaInO_3$ phase having a $\beta$-$Ga_2O_3$-type structure and the $(Ga, In)_2O_3$ phase were confirmed as seen from Tables 1 and 2.

When the oxide sintered body includes the $GaInO_3$ phase having a $\beta$-$Ga_2O_3$-type structure, the X-ray diffraction peak intensity ratio of the $GaInO_3$ phase having a $\beta$-$Ga_2O_3$-type structure defined by formula 1 below is shown in Table 1 and Table 2.

$$100 \times I[GaInO_3 \text{ phase }(111)]/\{I[In_2O_3 \text{ phase }(400)]+I[GaInO_3 \text{ phase }(111)]\}[\%] \quad \text{Formula 1}$$

TABLE 1

| | Ga/(In + Ga) Atomic ratio | Cu/(In + Ga + Cu) Atomic ratio | Sintering temperature (° C.) | Density of sintered body (g/cm³) | GaInO₃ (111) Peak intensity ratio | Structure of sintered body |
|---|---|---|---|---|---|---|
| Comparative Example 1 | 0.05 | 0.01 | 1400 | 7.05 | — | Only In₂O₃ |
| Comparative Example 2 | 0.08 | 0 | 1450 | 7.00 | — | Only In₂O₃ |
| Comparative Example 3 | 0.08 | 0.0001 | 1450 | 7.02 | — | Only In₂O₃ |
| Example 1 | 0.08 | 0.001 | 1450 | 7.02 | 2 | In₂O₃/GaInO₃ |
| Example 2 | 0.08 | 0.01 | 1400 | 7.03 | 4 | In₂O₃/GaInO₃ |
| Example 3 | 0.08 | 0.015 | 1400 | 7.00 | 5 | In₂O₃/GaInO₃ |
| Example 4 | 0.08 | 0.015 | 1200 | 6.81 | 3 | In₂O₃/GaInO₃ |
| Example 5 | 0.08 | 0.025 | 1350 | 6.97 | 7 | In₂O₃/GaInO₃ |
| Comparative Example 4 | 0.08 | 0.03 | 1400 | 6.38 | — | In₂O₃/In₂Ga₂CuO₇ |
| Comparative Example 5 | 0.08 | 0.03 | 1100 | 6.25 | — | In₂O₃/In₂Ga₂CuO₇ |
| Example 6 | 0.10 | 0.001 | 1400 | 7.00 | 10 | In₂O₃/GaInO₃ |
| Example 7 | 0.10 | 0.015 | 1400 | 6.99 | 13 | In₂O₃/GaInO₃ |
| Example 8 | 0.12 | 0.001 | 1400 | 6.96 | 15 | In₂O₃/GaInO₃ |
| Example 9 | 0.12 | 0.015 | 1400 | 6.95 | 19 | In₂O₃/GaInO₃ |
| Example 10 | 0.15 | 0.001 | 1400 | 6.94 | 24 | In₂O₃/GaInO₃ |
| Example 11 | 0.15 | 0.015 | 1400 | 6.94 | 28 | In₂O₃/GaInO₃ |

TABLE 2

| | Ga/(In + Ga) Atomic ratio | Cu/(In + Ga + Cu) Atomic ratio | Sintering temperature (° C.) | Density of sintered body (g/cm³) | GaInO₃ (111) Peak intensity ratio | Structure of sintered body |
|---|---|---|---|---|---|---|
| Comparative Example 6 | 0.15 | 0.05 | 1000 | 6.21 | — | In₂O₃/In₂Ga₂CuO₇/InGaCuO₄ |
| Example 12 | 0.19 | 0.001 | 1400 | 6.88 | 31 | In₂O₃/GaInO₃ |
| Example 13 | 0.19 | 0.01 | 1400 | 6.86 | 34 | In₂O₃/GaInO₃ |
| Example 14 | 0.19 | 0.015 | 1400 | 6.85 | 36 | In₂O₃/GaInO₃ |
| Example 15 | 0.19 | 0.015 | 1550 | 6.81 | 28 | In₂O₃/GaInO₃/(Ga,In)₂O₃ |
| Example 16 | 0.19 | 0.025 | 1400 | 6.84 | 37 | In₂O₃/GaInO₃ |
| Comparative Example 7 | 0.19 | 0.05 | 1400 | 6.29 | — | In₂O₃/In₂Ga₂CuO₇/InGaCuO₄ |
| Comparative Example 8 | 0.19 | 0.05 | 1000 | 6.15 | — | In₂O₃/In₂Ga₂CuO₇/InGaCuO₄ |
| Comparative Example 9 | 0.30 | 0.05 | 1400 | 6.70 | — | In₂O₃/In₂Ga₂CuO₇/InGaCuO₄ |

The oxide sintered body was machined to a size of 152 mm in diameter and 5 mm in thickness and the sputtering surface was grinded with a cup grinding wheel so that the maximum height Rz was 3.0 μm or less. The machined oxide sintered body was bonded to an oxygen-free copper backing plate by using metal indium to provide a sputtering target.

(Evaluation on Film Deposition by Sputtering)

Film deposition by direct current sputtering was performed at room temperature without heating the substrate by using the sputtering targets of Examples and Comparative Examples and an alkali-free glass substrate (Corning Eagle XG). The sputtering target was attached to a cathode of a direct current magnetron sputtering apparatus (available from Tokki Corporation) having a direct current power supply with no arcing suppression function. At this time, the target-substrate (holder) distance was fixed at 60 mm. After evacuation to $1 \times 10^{-4}$ Pa or less, a gas mixture of argon and oxygen was introduced at an appropriate oxygen ratio, which depended on the gallium content in each target, and the gas pressure was controlled to 0.6 Pa. A direct current plasma was generated by applying a direct current power of 300 W (1.64 W/cm$^2$). After presputtering for 10 minutes, the substrate was placed directly above the sputtering target, namely, in the stationary opposing position, and an oxide thin film having a thickness of 50 nm was deposited. The composition of the obtained oxide thin film was confirmed to be approximately the same as that of the target. In addition, as a result of X-ray diffraction measurement, the oxide thin film was confirmed to be amorphous. The obtained amorphous oxide thin film was subjected to a heat treatment at between 300 and 600° C. for shorter than 30 minutes in air by using an RTA (Rapid Thermal Annealing) apparatus. As a result of X-ray diffraction measurement for the oxide thin films after the heat treatment, the oxide thin films other than that of Comparative Example 9 were confirmed to be crystallized, and the main peak thereof was $In_2O_3$ (111). On the other hand, the oxide thin film of Comparative Example 9 was amorphous. The Hall-effect measurement was performed on the obtained crystalline or amorphous oxide semiconductor thin films to determine the carrier density and mobility. The obtained evaluation results are summarized in Table 3 and Table 4.

TABLE 3

| | Ga/(In + Ga) Atomic ratio | Cu/(In + Ga + Cu) Atomic ratio | Sintering temperature (° C.) | Heat treatment temperature (° C.) | Film thickness (nm) | Crystal structure of thin film | Carrier density ($\times 10^{17}$ cm$^{-3}$) | Carrier mobility (cm$^2$/V · s) |
|---|---|---|---|---|---|---|---|---|
| Comparative Example 1 | 0.05 | 0.01 | 1400 | 300 | 50 | Only $In_2O_3$ | 13 | 23.8 |
| Comparative Example 2 | 0.08 | 0 | 1450 | 300 | 50 | Only $In_2O_3$ | 14 | 24.5 |
| Comparative Example 3 | 0.08 | 0.0001 | 1450 | 300 | 50 | Only $In_2O_3$ | 11 | 24.2 |
| Example 1 | 0.08 | 0.001 | 1450 | 300 | 50 | Only $In_2O_3$ | 9.2 | 24.0 |
| Example 2 | 0.08 | 0.01 | 1400 | 325 | 50 | Only $In_2O_3$ | 4.8 | 23.4 |
| Example 3 | 0.08 | 0.015 | 1400 | 325 | 50 | Only $In_2O_3$ | 2.9 | 22.2 |
| Example 4 | 0.08 | 0.015 | 1200 | 325 | 50 | Only $In_2O_3$ | 2.3 | 22.3 |
| Example 5 | 0.08 | 0.025 | 1350 | 325 | 50 | Only $In_2O_3$ | 0.28 | 16.8 |
| Comparative Example 4 | 0.08 | 0.03 | 1400 | 325 | 50 | Only $In_2O_3$ | 0.022 | 8.1 |
| Comparative Example 5 | 0.08 | 0.03 | 1100 | 325 | 50 | Only $In_2O_3$ | 0.0089 | 3.8 |
| Example 6 | 0.10 | 0.001 | 1400 | 325 | 50 | Only $In_2O_3$ | 2.8 | 22.6 |
| Example 7 | 0.10 | 0.015 | 1400 | 325 | 50 | Only $In_2O_3$ | 1.9 | 21.5 |
| Example 8 | 0.12 | 0.001 | 1400 | 350 | 50 | Only $In_2O_3$ | 1.6 | 21.5 |
| Example 9 | 0.12 | 0.015 | 1400 | 350 | 50 | Only $In_2O_3$ | 1.5 | 20.3 |
| Example 10 | 0.15 | 0.001 | 1400 | 375 | 50 | Only $In_2O_3$ | 2.0 | 20.8 |
| Example 11 | 0.15 | 0.015 | 1400 | 375 | 50 | Only $In_2O_3$ | 0.94 | 20.2 |

TABLE 4

| | Ga/(In + Ga) Atomic ratio | Cu/(In + Ga + Cu) Atomic ratio | Sintering temperature (° C.) | Heat treatment temperature (° C.) | Film thickness (nm) | Crystal structure of thin film | Carrier density ($\times 10^{17}$ cm$^{-3}$) | Carrier mobility (cm$^2$/V · s) |
|---|---|---|---|---|---|---|---|---|
| Comparative Example 6 | 0.15 | 0.05 | 1000 | 375 | 50 | Only $In_2O_3$ | 0.019 | 6.2 |

TABLE 4-continued

|  | Ga/(In + Ga) Atomic ratio | Cu/(In + Ga + Cu) Atomic ratio | Sintering temperature (° C.) | Heat treatment temperature (° C.) | Film thickness (nm) | Crystal structure of thin film | Carrier density ($\times 10^{17}$ cm$^{-3}$) | Carrier mobility (cm$^2$/V · s) |
|---|---|---|---|---|---|---|---|---|
| Example 12 | 0.19 | 0.001 | 1400 | 450 | 50 | Only In$_2$O$_3$ | 0.26 | 17.7 |
| Example 13 | 0.19 | 0.01 | 1400 | 450 | 50 | Only In$_2$O$_3$ | 0.23 | 17.4 |
| Example 14 | 0.19 | 0.015 | 1400 | 450 | 50 | Only In$_2$O$_3$ | 0.2 | 17.0 |
| Example 15 | 0.19 | 0.015 | 1550 | 450 | 50 | Only In$_2$O$_3$ | 0.22 | 17.0 |
| Example 16 | 0.19 | 0.025 | 1400 | 450 | 50 | Only In$_2$O$_3$ | 0.14 | 15.3 |
| Comparative Example 7 | 0.19 | 0.05 | 1400 | 450 | 50 | Only In$_2$O$_3$ | 0.012 | 5.3 |
| Comparative Example 8 | 0.19 | 0.05 | 1000 | 450 | 50 | Only In$_2$O$_3$ | 0.089 | 3.5 |
| Comparative Example 9 | 0.30 | 0.05 | 1400 | 600 | 50 | Amorphous | 35 | 19.8 |

(Evaluation on Generation of Nodules)

The evaluation on the generation of nodules due to the film deposition by sputtering simulating mass production was carried out for the sputtering targets of Example 2 and Comparative Examples 1, 2, 5, and 8. As the sputtering apparatus, a load-lock-type pass-type magnetron sputtering apparatus equipped with a direct current power supply with no arcing suppression function (available from ULVAC Technologies, Inc.) was used. A square-shaped target 5 inches in height and 15 inches in width was used as the target. After evacuation of the sputtering chamber for the evaluation on film deposition by sputtering to 7×10$^{-5}$ Pa or less, a gas mixture of argon and oxygen was introduced at an appropriate oxygen ratio, which depended on the gallium content in each target, and the gas pressure was controlled to 0.6 Pa. The reason for selecting the sputtering gas under such conditions is because it is impossible to perform an appropriate evaluation when the degree of vacuum in the sputtering chamber is higher than 1×10$^{-4}$ Pa so that the moisture pressure in the chamber is high or a hydrogen gas is added. As it is well known in the ITO or the like, when H$^+$ derived from moisture or the hydrogen gas is incorporated into the film, the crystallization temperature of the film is increased and the film adheres to the target non-erosion portion is likely to be amorphous. As a result, the film stress decreases and thus the target non-erosion portion is less likely to peel off and the nodules are less likely to be generated. The direct current power was 2500 W (direct current power density: 5.17 W/cm$^2$) in consideration of that the direct current power density employed in mass production is generally about 3 to 6 W/cm$^2$.

As the evaluation on the generation of nodules, the presence or absence of the generation of nodules was evaluated by observing the target surface after continuous sputtering discharge at 50 kWh under the above conditions.

[Evaluation]

As shown in Table 1 and Table 2, when the gallium content is 0.08 or more and less than 0.20 in terms of Ga/(In+Ga) atomic ratio and the copper content is 0.001 or more and less than 0.03 in terms of Cu/(In+Ga+Cu) atomic ratio in Examples 1 to 16, the oxide sintered bodies are composed of an In$_2$O$_3$ phase having a bixbyite-type structure, and a GaInO$_3$ phase having a β-Ga$_2$O$_3$-type structure as a formed phase other than the In$_2$O$_3$ phase, or a GaInO$_3$ phase having a β-Ga$_2$O$_3$-type structure and a (Ga, In)$_2$O$_3$ phase as a formed phase other than the In$_2$O$_3$ phase.

In contrast, the oxide sintered body of Comparative Example 1 in which the gallium content is below 0.08 in terms of Ga/(In+Ga) atomic ratio and the oxide sintered bodies of Comparative Examples 2 and 3 in which the copper content is below 0.001 in terms of Cu/(In+Ga+Cu) atomic ratio are an oxide sintered body composed only of an In$_2$O$_3$ phase having a bixbyite-type structure. That is, the oxide sintered body of the present invention that is composed of an In$_2$O$_3$ phase having a bixbyite-type structure and a GaInO$_3$ phase having a β-Ga$_2$O$_3$-type structure or a GaInO$_3$ phase having a β-Ga$_2$O$_3$-type structure and a (Ga, In)$_2$O$_3$ phase as formed phases other than the In$_2$O$_3$ phase is not obtained. In addition, the copper content is 0.03 or more in terms of Cu/(In+Ga+Cu) atomic ratio in the oxide sintered bodies of Comparative Example 4 to 9, thus the formed phase other than the In$_2$O$_3$ phase having a bixbyite-type structure includes an In$_2$Ga$_2$CuO$_7$ phase and an InGaCuO$_4$ phase, and the desired oxide sintered body of the present invention is not obtained.

In addition, in the evaluation on the generation of nodules of Example 2, the generation of nodules was not observed in the target of Example 2 that was an oxide sintered body of the present invention. On the other hand, the generation of a large number of nodules was observed in the targets of Comparative Examples 1, 2, 5, and 8. In Comparative Examples 1 and 2, it is believed that this is because the structure of the sintered body is composed only of an In$_2$O$_3$ phase having a bixbyite-type structure although the density of the sintered body is high. In Comparative Example 5 and 8, the fact that the density of the sintered body is low and the In$_2$Ga$_2$CuO$_7$ phase and the InGaCuO$_4$ phase which have a high electrical resistance and are likely to remain by sputtering are included in the oxide sintered body is believed as the cause.

In addition, in Table 3 and Table 4, the properties of the crystalline oxide semiconductor thin films which contain indium, gallium, and copper as oxides and in which the gallium content is controlled to 0.08 or more and less than 0.20 in terms of Ga/(In+Ga) atomic ratio and the copper content is controlled to 0.001 or more and less than 0.03 in terms of Cu/(In+Ga+Cu) atomic ratio are shown.

The oxide semiconductor thin films of Examples are all found to be composed only of an In$_2$O$_3$ phase having a bixbyite-type structure. In addition, the oxide semiconductor thin films of Examples have a carrier density of $1.0 \times 10^{18}$ cm$^{-3}$ or less and a carrier mobility of 10 cm$^2$ V$^{-1}$ sec$^{-1}$ or more.

Among them, the oxide semiconductor thin films of Examples 1 to 4 and 6 to 15 in which the copper content is 0.001 or more and 0.015 or less in terms of Cu/(In+Ga+Cu) atomic ratio exhibited good properties, a carrier mobility of 17 cm$^2$ V$^{-1}$ sec$^{-1}$ or more. In particular among them, the oxide semiconductor thin films of Examples 1 to 4 and 6 to 11 in which the gallium content is limited to 0.08 or more and 0.15 or less in terms of Ga/(In+Ga) atomic ratio exhibited better properties, a carrier mobility of 20 cm$^2$ V$^{-1}$ sec$^{-1}$ or more.

In contrast, the oxide semiconductor thin films of Comparative Examples 1 to 3 are not suitable for the active layer in TFTs because the carrier density is above $1.0 \times 10^{18}$ cm$^{-3}$ although they are an oxide semiconductor thin film composed only of an In$_2$O$_3$ phase having a bixbyite-type structure. In addition, in the oxide semiconductor thin films of Comparative Examples 4 to 8, the copper content is 0.03 or more in terms of Cu/(In+Ga+Cu) atomic ratio and the carrier mobility is below 10 cm$^2$ V$^{-1}$ sec$^{-1}$, and thus the desired oxide semiconductor thin film of the present invention is not obtained. Furthermore, in the oxide semiconductor thin film of Comparative Example 9, the gallium content is 0.20 or more in terms of Ga/(In+Ga) atomic ratio and the copper content is 0.30 or more in terms of Cu/(In+Ga+Cu) atomic ratio, and the oxide semiconductor thin film is amorphous, thus the carrier density is above $1.0 \times 10^{18}$ cm$^{-3}$, and the desired oxide semiconductor thin film of the present invention is not obtained.

The invention claimed is:

1. An oxide sintered body comprising indium, gallium, and copper as oxides, wherein
   a gallium content is 0.08 or more and less than 0.20 in terms of Ga/(In+Ga) atomic ratio,
   a copper content is 0.001 or more and less than 0.03 in terms of Cu/(In+Ga+Cu) atomic ratio, and
   the oxide sintered body comprises
   an In$_2$O$_3$ phase having a bixbyite-type structure,
   and a GaInO$_3$ phase having a β-Ga$_2$O$_3$-type structure as a formed phase other than the In$_2$O$_3$ phase,
   or a GaInO$_3$ phase having a β-Ga$_2$O$_3$-type structure and a (Ga, In)$_2$O$_3$ phase as a formed phase other than the In$_2$O$_3$ phase.

2. The oxide sintered body according to claim 1, wherein the copper content is 0.001 or more and 0.015 or less in terms of Cu/(In+Ga+Cu) atomic ratio.

3. The oxide sintered body according to claim 1, wherein the gallium content is 0.08 or more and 0.15 or less in terms of Ga/(In+Ga) atomic ratio.

4. The oxide sintered body according to claim 1, wherein the oxide sintered body is substantially free of positive divalent elements other than copper and positive trivalent to positive hexavalent elements other than indium and gallium.

5. The oxide sintered body according to claim 1, wherein an X-ray diffraction peak intensity ratio of the GaInO$_3$ phase having a β-Ga$_2$O$_3$-type structure defined by formula 1 below is in the range of 2% or more and 77% or less:

100×I [GaInO$_3$ phase (111)]/{I [In$_2$O$_3$ phase (400)]+I [GaInO$_3$ phase (111)]}[%]   Formula 1.

6. A sputtering target obtained by machining the oxide sintered body according to claim 1.

7. A crystalline oxide semiconductor thin film obtained by forming an amorphous film on a substrate by sputtering using the sputtering target according to claim 6 and crystallizing the amorphous film by a heat treatment in an oxidizing atmosphere.

8. The oxide semiconductor thin film according to claim 7, wherein the oxide semiconductor thin film has a carrier mobility of 10 cm$^2$ V$^{-1}$ sec$^{-1}$ or more.

9. The oxide semiconductor thin film according to claim 7, wherein the oxide semiconductor thin film has a carrier density of $1.0 \times 10^{18}$ cm$^{-3}$ or less.

* * * * *